US008269498B2

(12) United States Patent
Zhang (10) Patent No.: US 8,269,498 B2
(45) Date of Patent: Sep. 18, 2012

(54) METHOD AND APPARATUS FOR MRI SIGNAL EXCITATION AND RECEPTION USING NON-RESONANCE RF METHOD (NORM)

(75) Inventor: Xiaoliang Zhang, San Francisco, CA (US)

(73) Assignee: The Regents of The University of California, Oakland, CA (US)

( * ) Notice: Subject to any disclaimer, the term of this patent is extended or adjusted under 35 U.S.C. 154(b) by 382 days.

(21) Appl. No.: 12/533,724

(22) Filed: Jul. 31, 2009

(65) Prior Publication Data

US 2010/0277171 A1 Nov. 4, 2010

Related U.S. Application Data

(60) Provisional application No. 61/175,426, filed on May 4, 2009.

(51) Int. Cl.
*G01V 3/00* (2006.01)
(52) U.S. Cl. .......................... 324/318; 324/322
(58) Field of Classification Search .......... 324/300–322; 600/407–445
See application file for complete search history.

(56) References Cited

U.S. PATENT DOCUMENTS

| | | | | |
|---|---|---|---|---|
| 2002/0075000 A1* | 6/2002 | Prammer et al. | ............... | 324/315 |
| 2006/0238198 A1* | 10/2006 | Nabetani | ..................... | 324/318 |
| 2009/0128154 A1* | 5/2009 | Chu et al. | ...................... | 324/322 |
| 2009/0224762 A1* | 9/2009 | Mehr et al. | ..................... | 324/314 |
| 2011/0257511 A1* | 10/2011 | Krueger | ......................... | 600/411 |
| 2012/0001629 A1* | 1/2012 | Hopper et al. | ................ | 324/303 |

FOREIGN PATENT DOCUMENTS

WO WO 2009/134920 A2 11/2009

OTHER PUBLICATIONS

Helszajn, J., Chapter 13 of *Microwave Planar Passive Circuits and Filters*, New York; John Wiley & Sons (1994).
Lee, R. et al., "Planar Strip Array (PSA) for MRI", *MRM*, 45: 673-683 (2001).
Zhang, X. et al., "Non-resonant microstrip (NORM) RF coils: an unconventional RF solution to MR imaging and spectroscopy", *Proceedings of International Society for Magnetic Resonance in Medicine*, 16 (May 2008) p. 435, Toronto, Canada.
Zhang, X et al., "Studies on MR Reception Efficiency and SNR of Non-resonance RF Method (NORM)", *Proceedings of International Society for Magnetic Resonance in Medicine*, 17 (2009) p. 104, Toronto, Canada.

* cited by examiner

*Primary Examiner* — Brij Shrivastav
(74) *Attorney, Agent, or Firm* — Morgan, Lewis & Bockius LLP; Jeffry S. Mann

(57) ABSTRACT

A system for MR signal excitation and reception and method which uses a non-resonant device or transmission line to perform MR imaging and spectroscopy. The system with non-resonant device is advantageous to parallel imaging due to the improved decoupling performance. Because the non-resonant RF coil is not generally sensitive to frequency, a MR system with the non-resonant RF coil is capable of multinuclear MR operation at varied magnetic field strength. The system comprises a non-resonant RF coil for connecting to an MR system, the conductor being configured to have a characteristic impedance matched to the MR system. The RF coil is configured to produce electromagnetic fields of differing strengths based on the constant characteristic impedance maintained in the system for exciting and receiving MR signals.

9 Claims, 6 Drawing Sheets

FIG. 1

·········· MR signal (low power) pathway
────── RF power (spin excitation, high power) pathway
══════ Pathway for both MR signal and RF power

FIG. 2

·········· MR signal (low power) pathway
────── RF power (spin excitation, high power) pathway
══════ Pathway for both MR signal and RF power

FIG. 5 one-wire transmission line

FIG. 6

Co-axial transmission line

METHOD AND APPARATUS FOR MRI SIGNAL EXCITATION AND RECEPTION USING NON-RESONANCE RF METHOD (NORM)

CROSS-REFERENCES TO RELATED APPLICATIONS

This application claims priority under 35 U.S.C. §119(e) to U.S. Provisional Application No. 61/175,426 filed May 4, 2009, the entire contents of which are incorporated herein by this reference for all purposes.

STATEMENT AS TO RIGHTS TO INVENTIONS MADE UNDER FEDERALLY SPONSORED RESEARCH AND DEVELOPMENT

This invention was made with government support under Grant No. EB 004453 awarded by the National Institutes of Health. The government has certain rights in the invention.

BACKGROUND

Conventionally, magnetic resonance (MR) signals are excited and received by an RF resonator comprised of an RF coil resonating at Larmor frequency. MR experiments with different nuclei or at different static field strengths usually require different RF coils which resonate at a desired frequency or frequencies. Since the discovery of the MR phenomena, resonant RF coils have generally been used for MR signal excitation and reception. Functioned as a filter, the resonance feature of the RF coils help reduce the noise level by rejecting other non MR signals, thereby potentially improving MR signal-to-noise ratio. However, the resonance requirement of RF coils creates many experimental complexities and technical challenges particularly in designing high and ultrahigh field (3T and above) coils, double or multiple-tuned coils and parallel imaging arrays. These technical difficulties/challenges dramatically hinder the development and the use of MR imaging due to the low RF coil quality, significantly reducing efficiency of the MR signal excitation and reception. One example is that in designing large-sized RF coils for high field MR imaging it is extremely difficult (or impossible) to achieve the required high resonant frequency due to the increased self-inductance and parasitic capacitance of the RF coils. Another example is that in designing RF coil arrays for parallel imaging, a daunting technical challenge is to attain sufficient electromagnetic decoupling among the resonant elements in coil arrays. Insufficient decoupling results in low efficiency of RF coil arrays, ultimately leading to low parallel imaging performance.

There is a trend to move to high and ultra high filed applications such as 300 MHz, 400 MHz, and above. With existing methods, it is extremely difficult to design RF coils for high field human MR imaging at high resonant frequencies due to the increased self-inductance and parasitic capacitance present with conventional RF coils. Coils for such applications generally are large and thus difficult to design and build to achieve the required high operating frequency. With conventional systems, the coils are specific to a narrow range of resonant frequencies. Therefore, the coil may need to be changed for different specimens.

BRIEF SUMMARY OF THE INVENTION

Various aspects of the present invention are directed to a method for MR imaging a target, the method comprising positioning a target proximate a non-resonant RF coil for connecting to an MR system, the RF coil being configured to have a characteristic impedance matched to the impedance of the MR system, wherein said non-resonant RF coil is configured to produce electromagnetic fields for generating MR signals from the target. In various embodiments, the method further comprises exciting MR signals with the non-resonant RF coil. In various embodiments, the non-resonant RF coil comprises at least a non-resonant conductor with the characteristic impedance matched to the impedance of MR system.

Various aspects of the present invention are directed to a RF coil for use with a non-resonance imaging device, the RF coil comprising a non-resonant device, a first T/R switch for connecting the coil to an RF power source and a first pre-amplifier, a second T/R switch for connecting the coil to a terminator and a second pre-amplifier wherein said terminator has an impedance matched to the characteristic impedance of the non-resonant device, and a power combiner connected to the first and second T/R switches, the power combiner configured to connect to an MR system, wherein during excitation of MR signals the first T/R switch connects the RF power source to the non-resonant RF coil at a predetermined characteristic impedance, the residual RF power going to the terminator via the second T/R switch, and wherein during reception MR signals from an excited sample are received by the non-resonant RF coil, transmitted to the first and second pre-amplifiers through the first and second T/R switches, equiphased by a phase shifter or a phase delay line, and thereafter combined by the combiner for transmission to the MR system.

Various aspects of the present invention are directed to a RF coil for use with a non-resonance imaging device, the RF coil comprising a non-resonant device, a first T/R switch for connecting the coil to an RF power source and a first pre-amplifier, a second T/R switch for connecting the coil to a first power combiner via a transmission line and a second pre-amplifier, and a second power combiner connected to the first and second T/R switches, the power combiner configured to connect to an MR system, wherein during excitation of MR signals the first T/R switch connects the RF power source to the non-resonant RF coil at a predetermined characteristic impedance, the residual RF power going to the first power combiner via the second T/R switch and a phase shifter or phase delay line, the RF power from the RF power source and the residual RF power equi-phased at the input ports of the first power combiner, and wherein during reception MR signals from an excited sample are received by the non-resonant RF coil, transmitted to the first and second pre-amplifiers through the first and second T/R switches, equi-phased by a phase shifter or a phase delay line, and thereafter combined by the combiner for transmission to the MR system.

Various aspects of the present invention are directed to a system for MR signal excitation, the system comprising a MR circuit configured to operate at a substantially constant impedance, a non-resonant RF coil connected to said MR circuit, said RF coil being configured to have a characteristic impedance matched to the impedance of the MR circuit, wherein said MR circuit is configured to reduce current fluctuations and maintain said substantial constant impedance across said RF coil.

Various aspects of the present invention are directed to a method for RF excitation comprising activating a non-resonance RF coil at a predetermined impedance, the non-resonance coil being configured to generate a first excitation signal as a magnetic field based on said predetermined impedance, directing the excitation signal to a first specimen, activating said non-resonance RF coil at said predetermined impedance to generate a second excitation signal, and directing the second excitation signal to a second specimen, wherein said first and second excitation signals are of different signal or field strengths.

The systems of the present invention, and the methods of using the same, have other features and advantages which will be apparent from or are set forth in more detail in the accompanying drawings, which are incorporated in and form a part of this specification, and the following Detailed Description of the Invention, which together serve to explain the principles of the present invention.

DETAILED DESCRIPTION OF THE INVENTION

The present inventions are directed to an RF coil solution using non-resonance RF coils for MR imaging and spectroscopy. "RF coil" is used herein to describe a device for creating an RF signal for MR imaging and includes, but is not limited to, conductive coils, microstrip transmission lines, and other RF devices as would be understood in the field of radiology and MR research. The non-resonance coil technique significantly simplifies the RF coil design and also overcomes numerous RF technical difficulties in designing high frequency coils, multiple tuned coils (for multi-nuclear MR applications) and parallel imaging coil arrays. We have demonstrated the non-resonance coil technology by $^1$H MR images, and $^{31}$P, $^{23}$Na and $^{13}$C spectra acquired using the non-resonant coil and the coil array. MR sensitivity (or signal-to-noise ratio, SNR) comparison has been also performed between the non-resonant coils and conventional resonant coils.

In various respects, the present invention makes use of coils similar to those described in U.S. Provisional Patent Application No. 61/050,178, filed May 2, 2008 and entitled METHOD AND APPARATUS FOR MAGNETIC RESONANCE IMAGING AND SPECTROSCOPY USING MULTIPLE-MODE COILS and International Patent Application No. PCT/US09/02158, filed Apr. 29, 2009 and entitled METHOD AND APPARATUS FOR MAGNETIC RESONANCE IMAGING AND SPECTROSCOPY USING MULTIPLE-MODE COILS, the entire contents of which are incorporated herein by this reference for all purposes.

Non-Resonance Method (NORM) for MR Signal Excitation and Reception:

Turning to the figures, a system for MR signal excitation and reception and method are disclosed which use a non-resonant device or transmission line to perform MR imaging and spectroscopy. In contrast to conventional devices, the system in accordance with the present inventions does not rely on MR resonance. The non-resonant device or transmission line is used to excite and receive MR signals.

Figure 1:
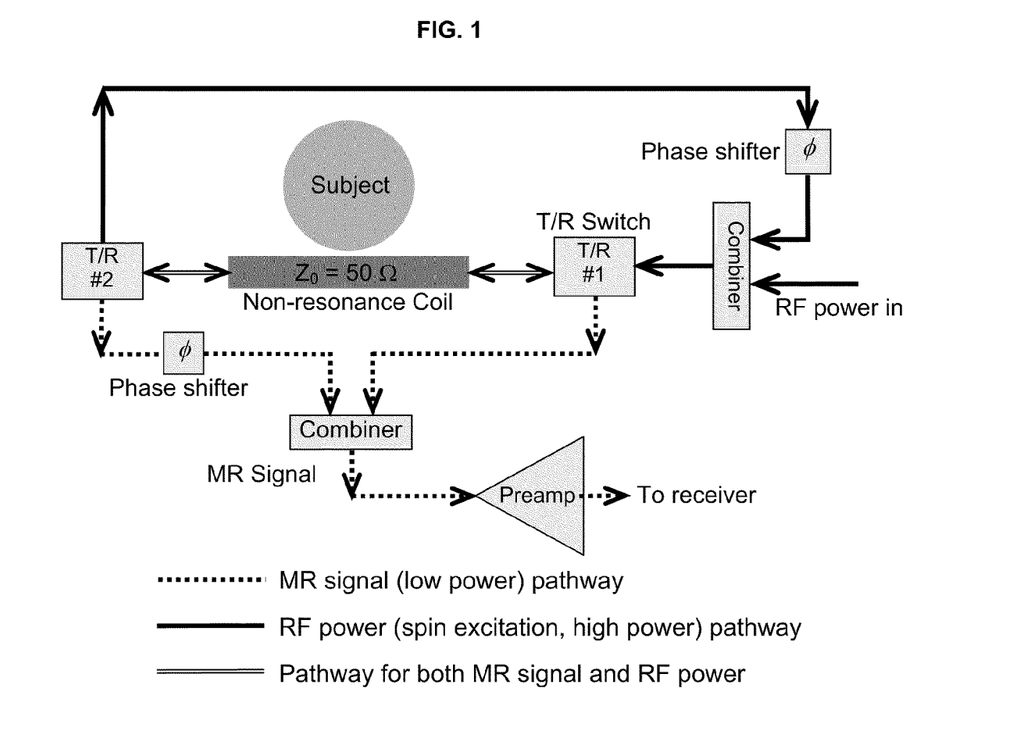
FIG. 1 is an exemplary block sketch for the connection circuit of the proposed non-resonance method (NORM) coil or one non-resonant element in a coil array in accordance with the present invention.

FIG. 1 shows a schematic of the non-resonance method in accordance with the present invention. The method is generally frequency-insensitive, highly efficient, yields excellent decoupling, and suits a wide variety of RF coil designs. The resulting instrument can operate across a wide range of frequencies for almost any nucleus at almost any magnetic field strength. When combined with microstrip transmission technology, the electromagnetic coupling obstacle inherent with resonant devices is overcome by the present inventions without the use of complicated, sensitivity-decreasing decoupling circuits. This novel non-resonance technology for MR signal excitation and reception has a potential to resolve many of the technical difficulties and design complexities encountered in current MR methodology and potentially replace the current technology, especially for high and ultrahigh field MRI.

FIG. 1 is an exemplary block sketch for the connection circuit of the proposed non-resonance method (NORM) coil or one non-resonant element in a coil array in accordance with the present invention. During the excitation phase, RF power from the RF amplifier is delivered to the power combiner from the RF amplifier via a power combiner and T/R (transmit and receive switch which can switch the circuit between transmit circuit and receive circuit) switch #1 to the exemplary non-resonant coil (with a characteristic impedance of 50 Ohm), and then the residual RF power coming out from another end of the non-resonant coil goes back to the input port of the power combiner via T/R switch #2 and a phase shifter which ensures the currents/voltages are in phase at the input port of the power combiner.

When the RF power goes through the NORM coil, the RF magnetic field (B1) is generated and the MR sample is excited. During the reception phase, MR signal radiated from the excited sample is detected by the NORM coil and transmitted to the two T/R switches #1 and #2, and then the MR signal from one end of the non-resonant coil goes though a phase shifter in order for it to be in phase with the MR signal coming out from another end of the non-resonant coil. After the phase adjustment, the two signals are combined at a power combiner. In various embodiments, the combined MR signal goes to the preamplifier to get amplified before the signals are sent to the Receiver of the MR system. MR image or spectroscopy is then obtained. Compared with the previous connection shown in ref 1, the RF excitation power may be significantly reduced due to the reuse of the residual RF power although the reception part is kept almost the same. The device may also generate a magnetic field and excitation signal for a broader spectrum range with a single coil.

Figure 4:
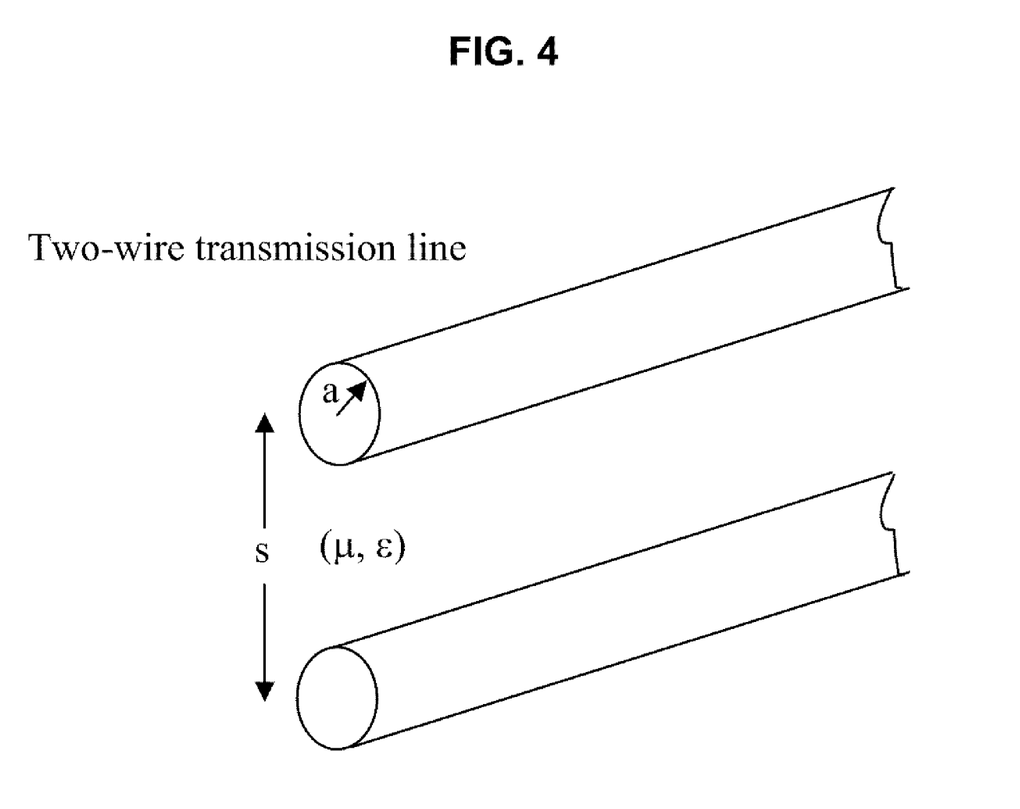
FIG. 4 is a schematic diagram of a two-wire transmission line which can be used as non-resonant device in the system of FIG. 1 for MR signal excitation and reception.
Figure 5:
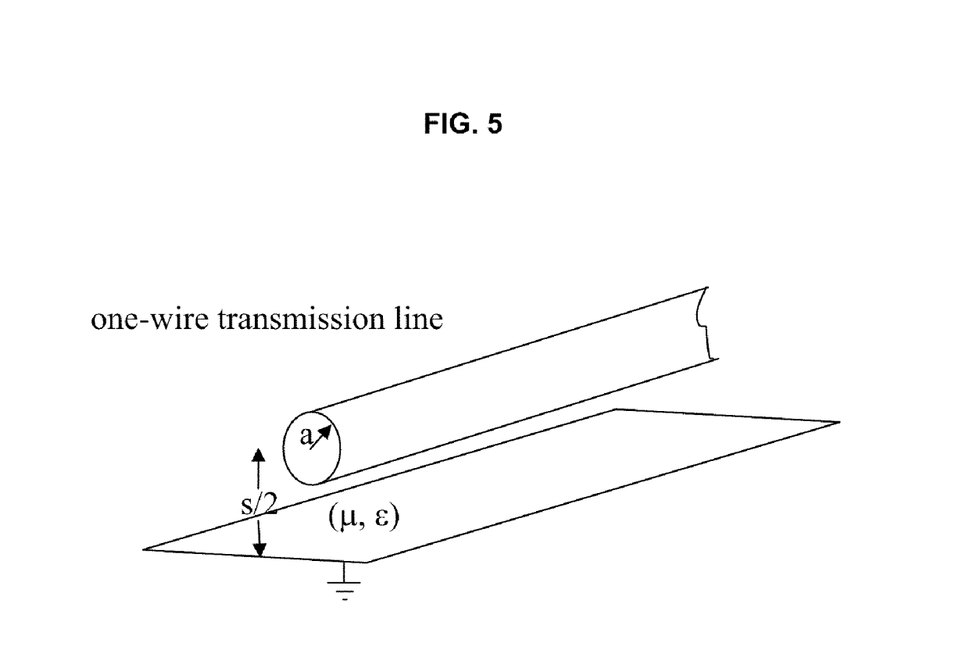
FIG. 5 is a schematic diagram of an exemplary one-wire transmission line which can be used as non-resonant device in the system of FIG. 1.
Figure 6:
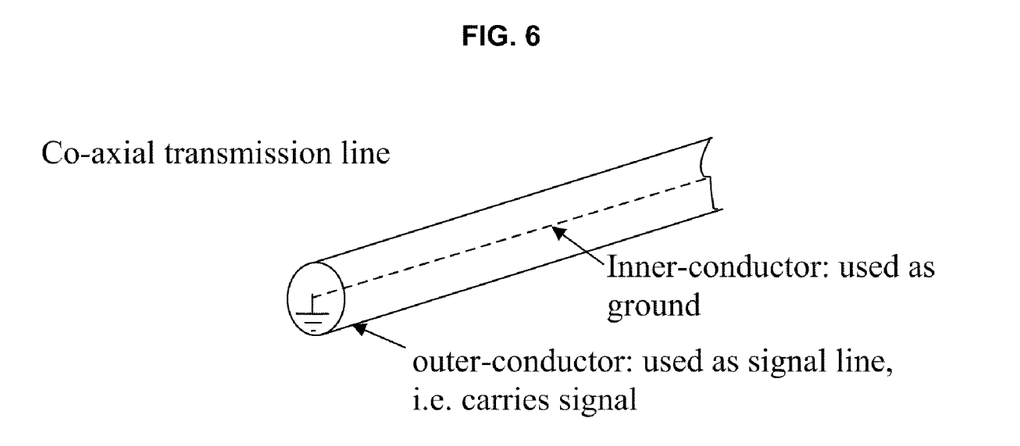
FIG. 6 is a schematic diagram of exemplary co-axial transmission line which can be used as non-resonant device in the system of FIG. 1.

The non-resonant RF coil or one element of a coil array illustrated in FIG. 1 is a non-resonant device which can be almost any type of non-resonant transmission line. The non-resonant device can be made of two-wire transmission line (FIG. 4), one-wire transmission line (FIG. 5), coaxial transmission line (FIG. 6), microstrip transmission line (FIG. 7) or its derivatives and other types of transmission lines.

In various embodiments, no matter what kind of device is used to realize the non-resonance method for MR signal excitation and reception in accordance with the invention, the characteristic impedance of the device is substantially the same as the characteristic impedance of the MR system. In various embodiments, this impedance is 50 Ohm.

In the exemplary system, no terminative capacitors ($C_T$) are provided at the ends of the RF coil. In the embodiment illustrated in FIG. 7, 50 Ohm capacitors are provided at each end of the RF coil. The system in accordance with the present invention does not rely on the presence or absence of such terminative capacitors. Instead, one will appreciate from the description herein that the system is configured such that the RF coil does not "see" any impedance change during operation. In the exemplary device, the impedance is 50 Ohms throughout the whole system. The non-resonance method described is enabled by the fact that the RF coil does not experience power current reflection; the characteristic impedance is maintained at a substantially constant level. In other words, the impedance is maintained within a constant, narrow range. Thus, even if the 50 Ohm terminative capacitors are removed, the RF coil will experience 50 Ohm impedance.

The two phase shifters shown in FIG. 1 form a part of the NORM technology. In various embodiments, the signals are in-phase at the point of the two input ports of the power combiners. Otherwise, if they are not in-phase, the combined signal might be reduced or even completely cancelled. A simple way (but less efficiency of MR signal excitation and/or reception) to perform NORM technology is sketched in FIG. 2 and FIG. 3.

The method for determining the characteristic impedance with the exemplary system will now be described. The system is set up in a conventional manner. The characteristic impedance is then determined based on the baseline. The system is tuned to the determined characteristic impedance.

Figure 2:
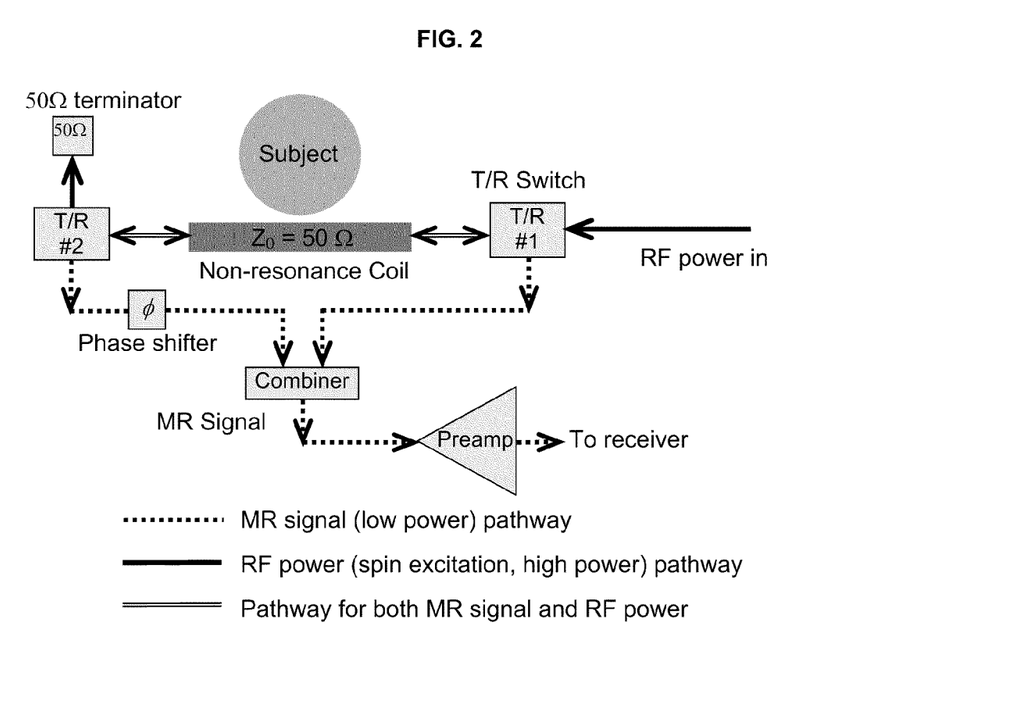
FIG. 2 is a block sketch for an exemplary simplified connection circuit of a non-resonance method (NORM) coil or one non-resonant element in a coil array similar to that of FIG. 1.

FIG. 2 illustrates another exemplary connection circuit using a non-resonance method (NORM) coil or one non-resonant element in a coil array in accordance with the present invention. By this connection, the residue of the exemplary RF power is consumed in the 50 Ohm terminator and the efficiency of excitation is low compared with the exemplary setup shown in FIG. 1.

Figure 8:
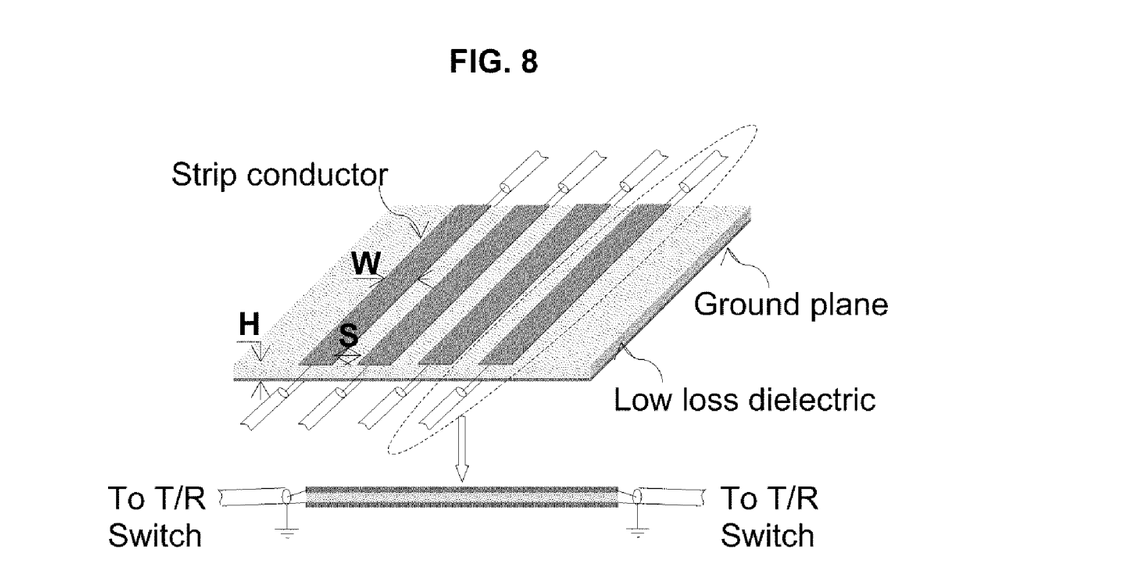
FIG. 8 is a setup of four element array of non-resonant microstrip transmission lines of FIG. 7 for parallel imaging with excellent decoupling and their connections to the MR system of FIG. 1.

Testing results indicated that the exemplary 4-element non-resonant coil array (implemented by using non-resonant microstrip transmission line) shown in FIG. 8 achieved an excellent decoupling among the 4 elements. The impedance matching and decoupling measurements taken on a network analyzer are demonstrated in FIG. 9. The performance of decoupling achieved is previously difficult, if not impossible, to achieve with existing resonant coils. Therefore, non-resonance method may provide a robust solution to coil array designs to facilitate the parallel imaging, may improve upon the traditional, slow imaging algorithm.

Figure 3:
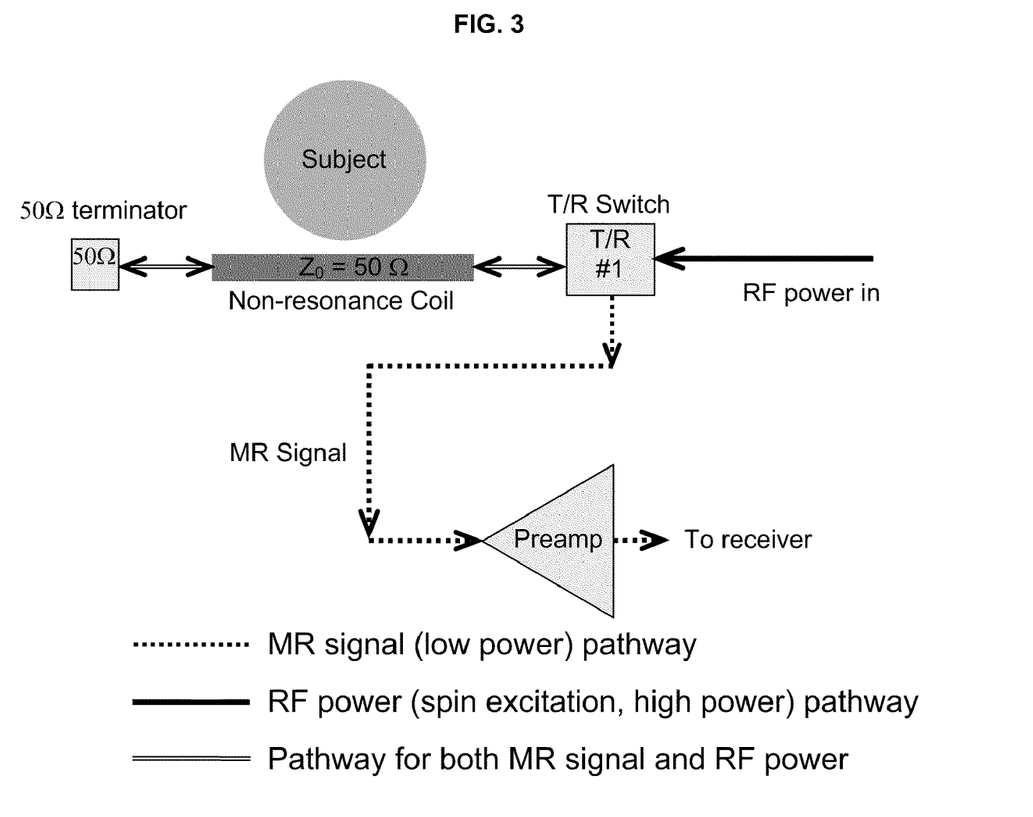
FIG. 3 is a block sketch for the further simplified connection circuit of a non-resonance method (NORM) coil or one non-resonant element in a coil exemplary array similar to that of FIG. 1.

FIG. 3 illustrates yet another exemplary connection circuit using the proposed non-resonance method (NORM) coil or one non-resonant element. By this connection, the residue of the RF power and at least half of the MR signals are consumed in the 50 Ohm terminator and thus the efficiency of both excitation and reception is low compared with the setup shown in FIG. 1.

Figure 7:
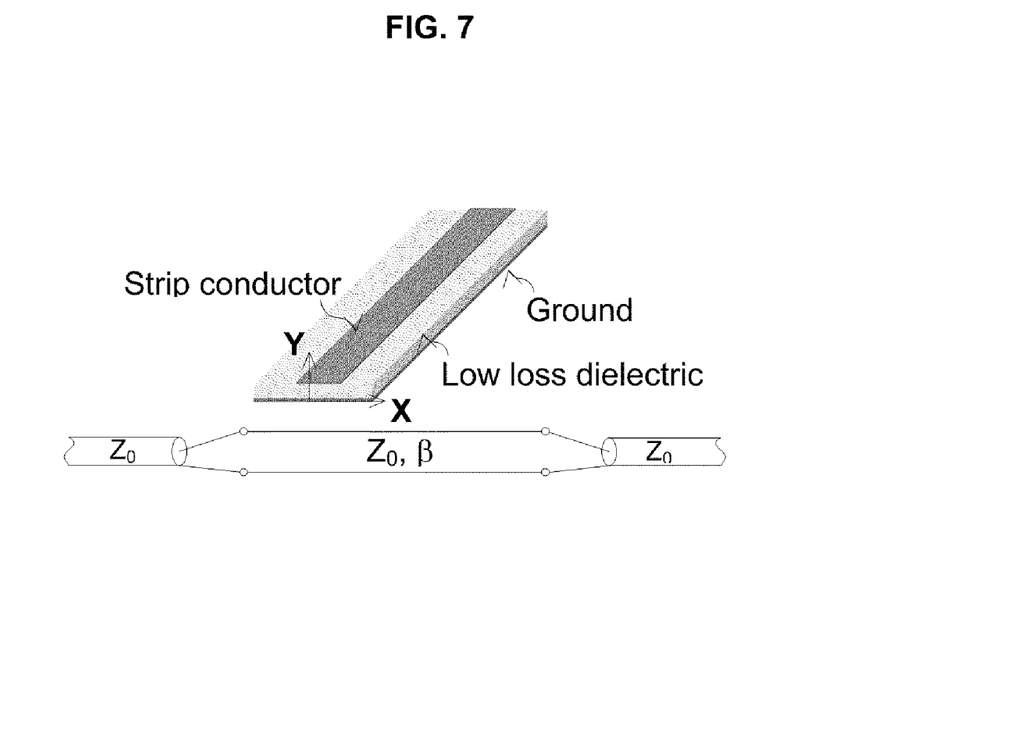
FIG. 7 is a structure of exemplary non-resonant microstrip transmission line and its connection to the MR system of FIG. 1.

FIG. 4 to FIG. 7 illustrate exemplary non-resonant devices for use with the non-resonance method for MR signal excitation and reception in accordance with the present inventions. FIG. 7 is a structure of exemplary non-resonant microstrip transmission line and its connection to the MR system co-axial cable in a non-resonance method setup. The characteristic impedance Z0 of the exemplary microstrip transmission line is 50 Ohm which is equal to that of MR system. There is no matching or tuning circuits needed for the NORM coil. FIG. 8 is a setup of a 4 element non-resonant microstrip transmission line array for parallel imaging with excellent decoupling and their connections to the MR system co-axial cable. The characteristic impedance $Z_0$ of the each microstrip transmission line is 50 Ohm which is equal to that of MR system. There is no matching or tuning circuits needed for the NORM coil.

Figure 9:
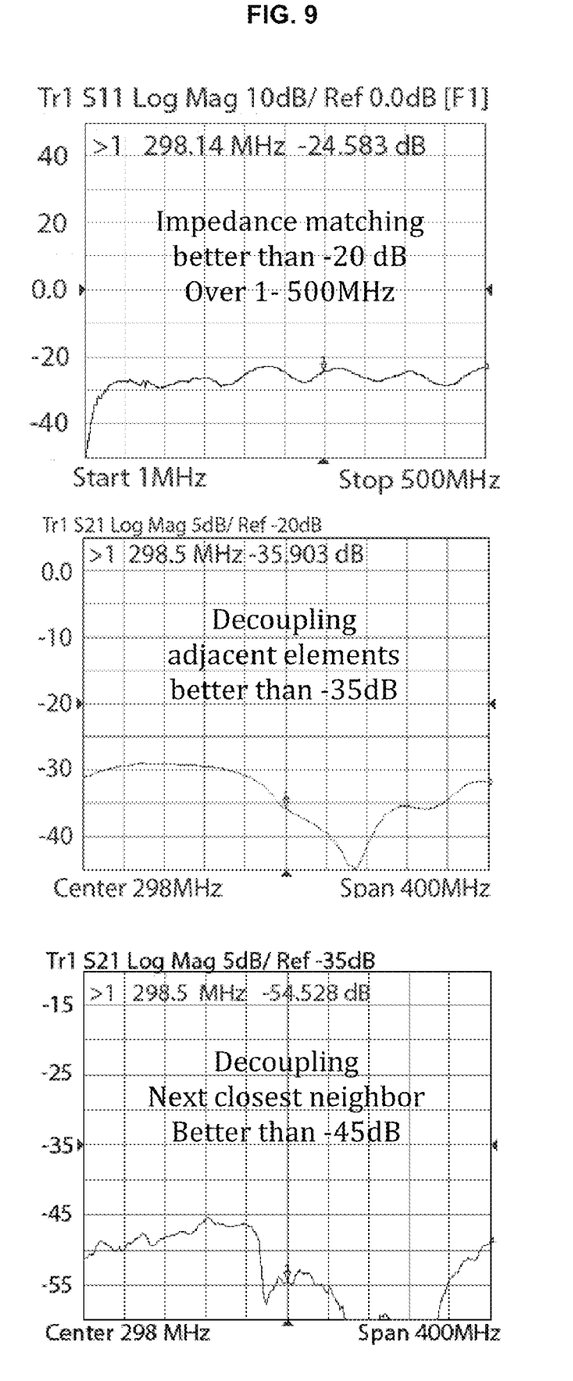
FIG. 9 illustrates results obtained with the exemplary system of FIG. 1.

FIG. 9 illustrates results obtained with the exemplary apparatus of FIG. 1. The S11 and S21 measurements taken on a network analyzer showing a excellent impedance match and decoupling among elements, which is previously difficult, if not impossible, to achieve with traditional resonant coil designs.

With conventional resonant RF coils, coil size is usually limited by the resonant frequency. By contrast, the non-resonance method in accordance with the present invention provides a robust approach to RF coil designs with nearly no coil-size limitations. This is an unparalleled advantage over the existing resonant coils and may be a solution to MR body coils at high fields. For example, due to the high frequency and large-size, currently there is no body coil available which can cover whole body in order to attain whole body imaging at 7 tesla.

In clinical MR scanners (3 T or lower) the body coil (which is a resonator resonating at 1H Larmor frequency at the corresponding magnetic field strength) usually is embedded in the MR magnet and is difficult to change for use with other nuclei (which need different frequency than 1H's). Therefore, the body coil can be only In addition, due to the simple structure, no lumped elements such as capacitors and inductors, the non-resonant coil is easy to build, durable and low-cost. The invention of the non-resonance coil design technology is a breakthrough in MR RF technology which is capable of overcoming many design difficulties and coil quality degradations of existing coils and methods, especially at high and ultrahigh fields.

The advantages of the apparatus and method of the present invention is exemplified with proton imaging. An exemplary nucleus is imaged at 1.5 Tesla and 64 MHz. The frequency, however, changes to 300 MHz when increasing the filed to 7 Tesla. By comparison, with the apparatus of the present invention, the same nucleus may be imaged at different field strengths without changing the resonance frequency in large part because the apparatus does not make use of conventional MR coils and MR methods.

What is claimed is:

1. A system for MR signal excitation and reception for a non-resonance imaging device, said system comprising:
   a non-resonant RF device;
   a first transmit/receive switch for connecting the non-resonant RF device to an RF power source and a first preamplifier;
   a second transmit/receive switch for connecting the non-resonant RF device to a terminator and a second preamplifier, wherein a power combiner has an impedance matched to a characteristic impedance of the non-resonant device; and
   the power combiner connected to the first and second transmit/receive switches, the power combiner configured to connect to an MR system, wherein during excitation of MR signals, the first transmit/receive switch connects the RF power source to the non-resonant RF device at a predetermined characteristic impedance, a residual RF power going to the terminator via the second transmit/receive switch, and wherein during reception MR signals from an excited sample are received by the non-resonant RF device, transmitted to the first and second pre-amplifiers through the first and second transmit/receive switches, equi-phased by a phase shifter or a phase delay line, and thereafter combined by the power combiner for transmission of the MR signals to the MR system.

2. The apparatus according to claim 1, wherein during reception, the MR signals from the excited sample are received by the non-resonant RF device, transmitted to the first and second pre-amplifiers through the first and second transmit/receive switches.

3. The apparatus according to claim 1, wherein the non-resonant RF device includes a non-resonant RF coil or a non-resonant RF coil array.

4. The method according to claim 1, wherein the non-resonant RF coil is a non-resonant RF coil array having one of a semi-cylindrical volume coil array, a part of a semi-cylindrical volume coil, a part of a full-cylindrical volume coil array, a full-cylindrical volume coil array, and a substantially planar coil array.

5. The method according to claim 1, wherein the non-resonant RF coil is a multi-frequency coil configured for double or multiple nuclear MR signal excitation and reception.

6. A system for MR signal excitation and reception for a non-resonance imaging device, said RF coil system comprising:
   a non-resonant RF device;
   a first transmit/receive switch for connecting the non-resonant RF device to an RF power source and a first pre-amplifier;
   a second transmit/receive switch for connecting the non-resonant device to a first power combiner via a transmission line and a second pre-amplifier; and
   a second power combiner connected to the first and second transmit/receive switches, the second power combiner configured to connect to an MR system, wherein during excitation of MR signals the first transmit/receive switch connects the RF power source to the non-resonant RF device at a predetermined characteristic impedance, a residual RF power going to the first power combiner via the second transmit/receive switch and a phase shifter or a phase delay line, wherein RF power from the RF power source and the residual RF power are equi-phased at input ports of the first power combiner, and wherein during reception, MR signals from an excited sample are received by the non-resonant RF coil, transmitted to the first and second pre-amplifiers through the first and second transmit/receive switches, equi-phased by a phase shifter or a phase delay line, and thereafter combined by the second combiner for transmission to the MR system.

7. The apparatus according to claim 6, wherein the non-resonant RF device includes a non-resonant RF coil or a non-resonant RF coil array.

8. The method according to claim 6, wherein the non-resonant RF coil is a non-resonant RF coil array having one of a semi-cylindrical volume coil array, a part of a semi-cylindrical volume coil, a part of a full-cylindrical volume coil array, a full-cylindrical volume coil array, and a substantially planar coil array.

9. The method according to claim 6, wherein the non-resonant RF coil is a multi-frequency coil configured for double or multiple nuclear MR signal excitation and reception.

* * * * *